(12) United States Patent
Goldenshtein

(10) Patent No.: US 9,673,023 B2
(45) Date of Patent: Jun. 6, 2017

(54) SYSTEM FOR DISCHARGING AN AREA THAT IS SCANNED BY AN ELECTRON BEAM

(71) Applicant: APPLIED MATERIALS ISRAEL LTD., Rehovot (IL)

(72) Inventor: Alex Goldenshtein, Nes Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 14/710,297

(22) Filed: May 12, 2015

(65) Prior Publication Data
US 2016/0336146 A1   Nov. 17, 2016

(51) Int. Cl.
 *H01J 37/28* (2006.01)
 *H01J 37/22* (2006.01)

(52) U.S. Cl.
 CPC ............ *H01J 37/226* (2013.01); *H01J 37/28* (2013.01); *H01J 2237/04* (2013.01); *H01J 2237/063* (2013.01); *H01J 2237/2801* (2013.01)

(58) Field of Classification Search
 CPC .... H01J 37/28; H01J 2237/2482; H01J 37/22; H01J 2237/0047; H01J 2237/0048; H01J 2237/06333; H01J 2237/063
 See application file for complete search history.

(56) References Cited

U.S. PATENT DOCUMENTS

| | | | | |
|---|---|---|---|---|
| 6,476,387 B1* | 11/2002 | Nishimura | ............... | H01J 37/28 250/307 |
| 9,040,909 B2* | 5/2015 | Parker | ................ | G01N 21/6428 250/306 |
| 2006/0289755 A1* | 12/2006 | Koyama | ............... | H01J 37/026 250/310 |
| 2007/0023655 A1* | 2/2007 | Nishikata | ............... | H01J 37/228 250/310 |
| 2009/0242800 A1* | 10/2009 | Kuribara | ................ | G01B 15/04 250/459.1 |
| 2010/0108882 A1* | 5/2010 | Zewail | ..................... | H01J 37/22 250/307 |
| 2010/0108883 A1* | 5/2010 | Zewail | ..................... | H01J 37/22 250/307 |
| 2011/0068267 A1* | 3/2011 | Hasegawa | ............ | G01N 23/225 250/310 |
| 2011/0204228 A1* | 8/2011 | Tsuno | .................... | H01J 37/224 250/310 |
| 2011/0248164 A1* | 10/2011 | Straw | ..................... | H01J 37/226 250/307 |
| 2014/0014848 A1* | 1/2014 | Hatakeyama | ...... | G01N 23/2251 250/393 |
| 2015/0340193 A1* | 11/2015 | Yoshikawa | ........ | G01N 23/2204 250/310 |
| 2016/0211112 A1* | 7/2016 | Nakao | ................... | H01J 37/226 |

* cited by examiner

Primary Examiner — Wyatt Stoffa
(74) Attorney, Agent, or Firm — Kilpatrick Townsend & Stockton LLP

(57) ABSTRACT

A method and a system for imaging an object, the system may include electron optics that may be configured to scan a first area of the object with at least one electron beam; wherein the electron optics may include a first electrode; and light optics that may be configured to illuminate at least one target of (a) the first electrode and (b) the object, thereby causing an emission of electrons between the first electrode and the object.

20 Claims, 16 Drawing Sheets

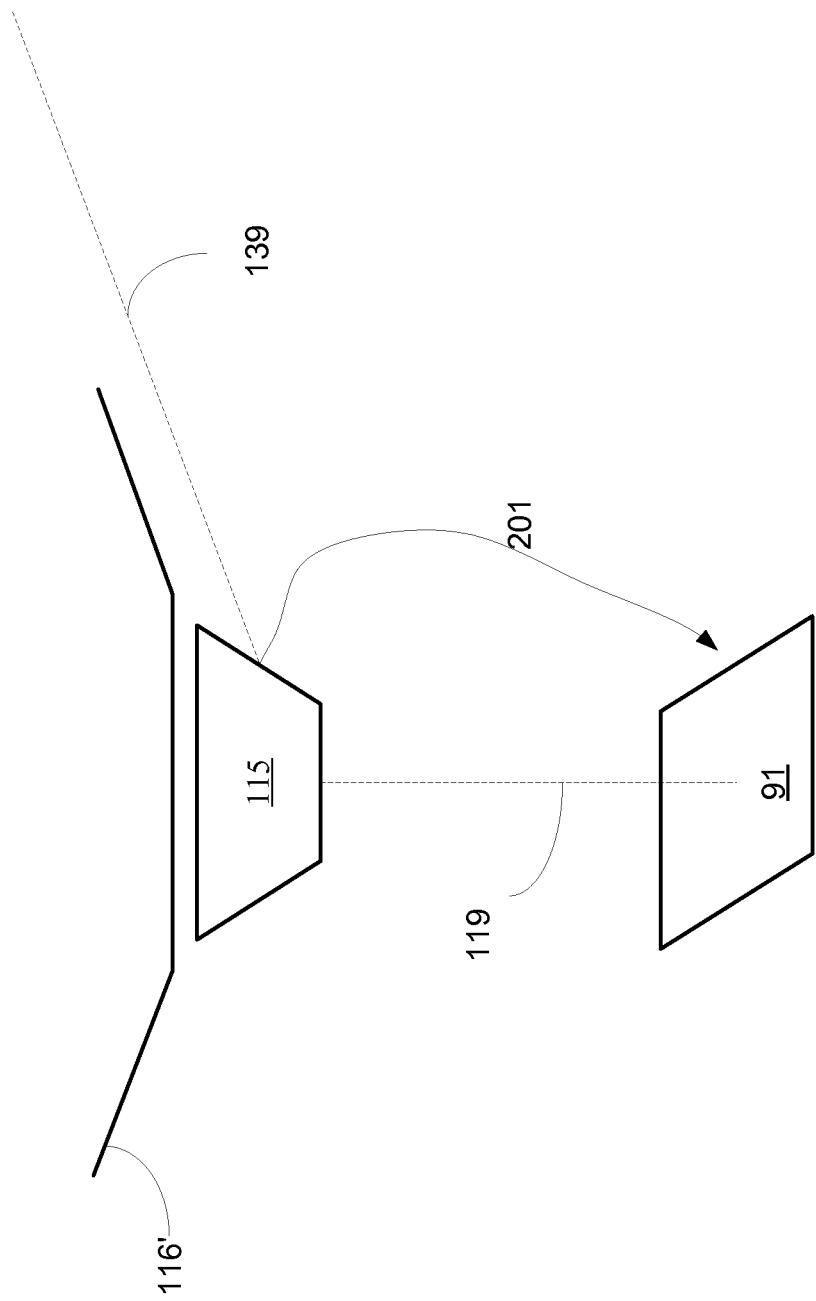

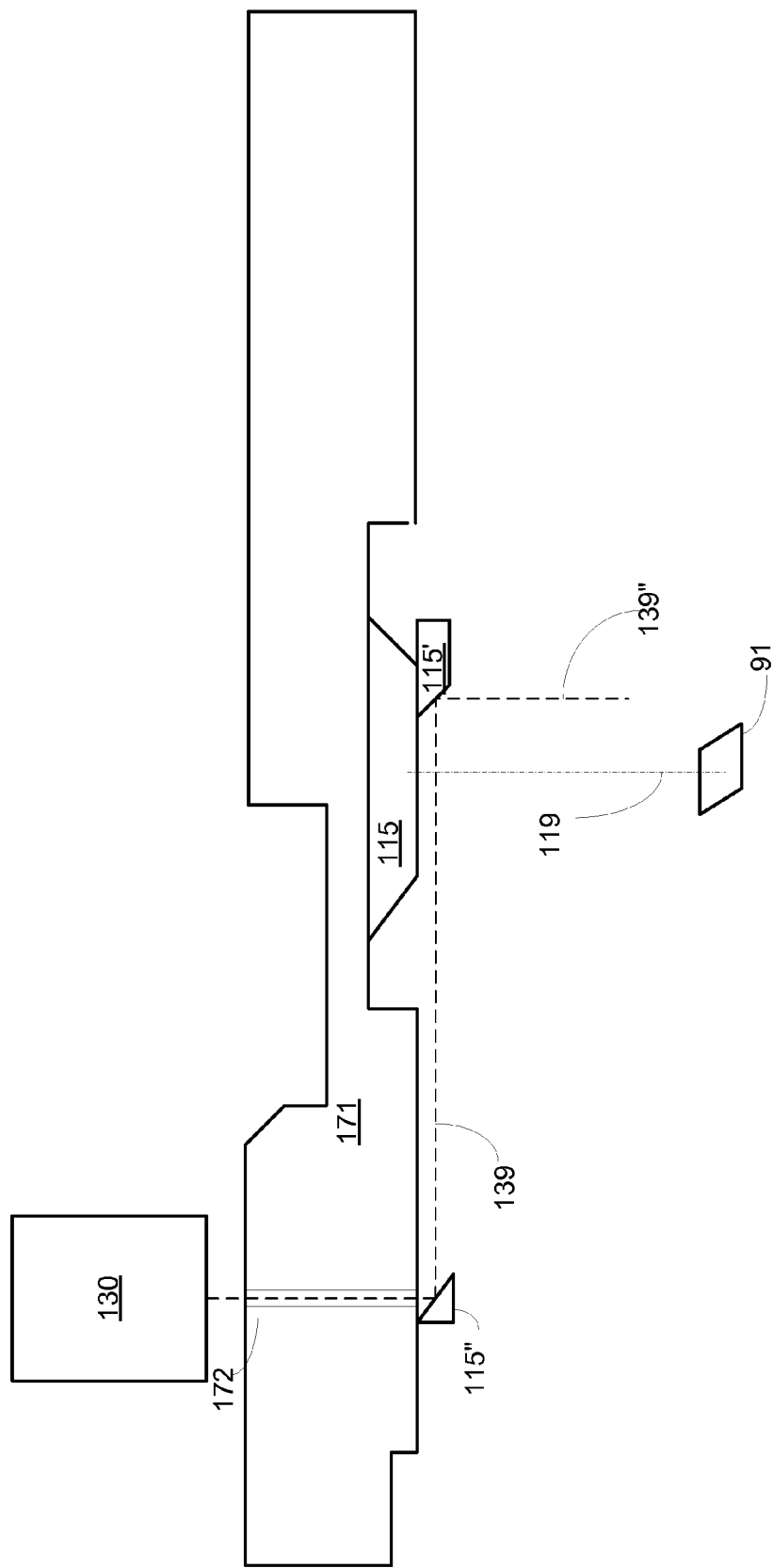

SYSTEM FOR DISCHARGING AN AREA THAT IS SCANNED BY AN ELECTRON BEAM

BACKGROUND OF THE INVENTION

Electron beam inspection (EBI) tools scan areas of a wafer with an electron beam.

A scanning of an area with an electron beam causes the area to emit electrons such as secondary electrons and backscattered electrons. The EBI tool detects some of the emitted electrons and generates an image of the area.

The scanning of the area also charges the area. The charging of the area may distort the image of the area or may distort images of areas that are electrically coupled to the area.

There is a growing need to discharge scanned areas.

SUMMARY OF THE INVENTION

According to an embodiment of the invention there may be provided a system for imaging an object, the system may include electron optics that may be configured to scan a first area of the object with at least one electron beam; wherein the electron optics may include a first electrode; and light optics that may be configured to illuminate at least one target of (a) the first electrode and (b) the object, thereby causing an emission of electrons between the first electrode and the object.

The emission of the electrons at least partially may compensate for a charging of the first area by the at least one electron beam.

The light optics may be configured to illuminate the at least one target thereby causing an emission of electrons between the first electrode and the first area.

The light optics may be configured to illuminate both the first electrode and the object.

The system may include a controller that may be configured to determine which target of the at least one target to illuminate by the light optics.

The determination of which target to illuminate may be responsive to potentials of the object and of the first electrode.

The controller may be configured to determine to illuminate the first electrode when the first area is more positive than the first electrode.

The first electrode may include a metal mirror. The light optics may be configured to illuminate the metal mirror with a beam of light; and wherein the metal mirror may be configured to direct the beam of light towards the first area.

The metal mirror may be also configured to emit the electrons towards the first area when the first area is more positive than the first electrode.

The light optics may be configured to illuminate the first area and the first electrode simultaneously.

The first area may be scanned during a scan period. The light optics may be configured to illuminate the first area and the first electrode at different points in time during the scan period.

The system may include biasing circuits for providing a same biasing voltage to the first electrode and to the object.

The system may include biasing circuits for providing different biasing voltages to the first electrode and to the object.

The light optics may be configured to illuminate the at least one target thereby causing an emission of electrons between the first electrode and a second area that differs from the first area.

The object may be a mask.

The first electrode may be closer to the object than any other electrode of the electron optics.

The electron optics may include a column and wherein the first electrode may be spaced apart from the column.

According to an embodiment of the invention there may be provided a system for imaging an object, the system may include: electron optics that may be configured to scan a first area of the object with at least one electron beam; wherein the electron optics may include a first electrode; and light optics that may be configured to illuminate the first electrode thereby causing the first electrode to emit electrons towards the object when the object is more positive than the first electrode.

The light optics may be configured to illuminate the first area thereby causing the first area to emit electrons towards the first electrode when the first area is more negative than the first electrode.

The first electrode may include a metal mirror; wherein the light optics may be configured to illuminate the metal mirror with a beam of light; and wherein the metal mirror may be configured to direct the beam of light towards the first area.

The metal mirror may be configured to emit the electrons towards the first area when the first area is more positive than the first electrode.

The light optics may be configured to illuminate the first area and the first electrode simultaneously.

The first area may be scanned during a scan period; and wherein the light optics may be configured to illuminate the first area and the first electrode at different points in time during the scan period.

The system may include biasing circuits for providing a same biasing voltage to the first electrode and to the object.

The system may include biasing circuits for providing different biasing voltages to the first electrode and to the object.

The first electrode may be closer to the object than any other electrode of the electron optics.

The electron optics may include a column and wherein the first electrode may be spaced apart from the column.

According to an embodiment of the invention there may be provided a system for imaging an object, the system may include electron optics that may be configured to scan a first area of the object with at least one electron beam; wherein the electron optics may include a first electrode; and light optics that may be configured to illuminate, with at least one light beam, (a) the first electrode, and (b) the first area, thereby causing (i) an emission of electrons from the first electrode towards the first area when the first area is positive in relation to the first electrode; and (ii) an emission of electrons from the first area towards the first electrode when the first area is negative in relation to the first electrode.

The first electrode may be closer to the object than any other electrode of the electron optics.

The electron optics may include a column and wherein the first electrode may be spaced apart from the column.

According to an embodiment of the invention there may be provided a method for imaging an object, the method may include scanning, by electron optics, a first area of the object with at least one electron beam; wherein the electron optics may include a first electrode; wherein the scan of the first area induces a change in a charging of the area; and illuminating, by light optics, at least one target of (a) the first electrode and (b) the object thereby causing an emission of electrons between the first electrode and the object.

Any combinations of any of the components of any of the figures can be provided.

Any combination of any of the mentioned below systems can be provided.

Any combination of any of the mentioned below methods can be provided

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

FIG. 2A illustrates a portion of a system and emitted electrons according to an embodiment of the invention;

FIG. 3 illustrates a portion of a system according to an embodiment of the invention;

Figure 1A:
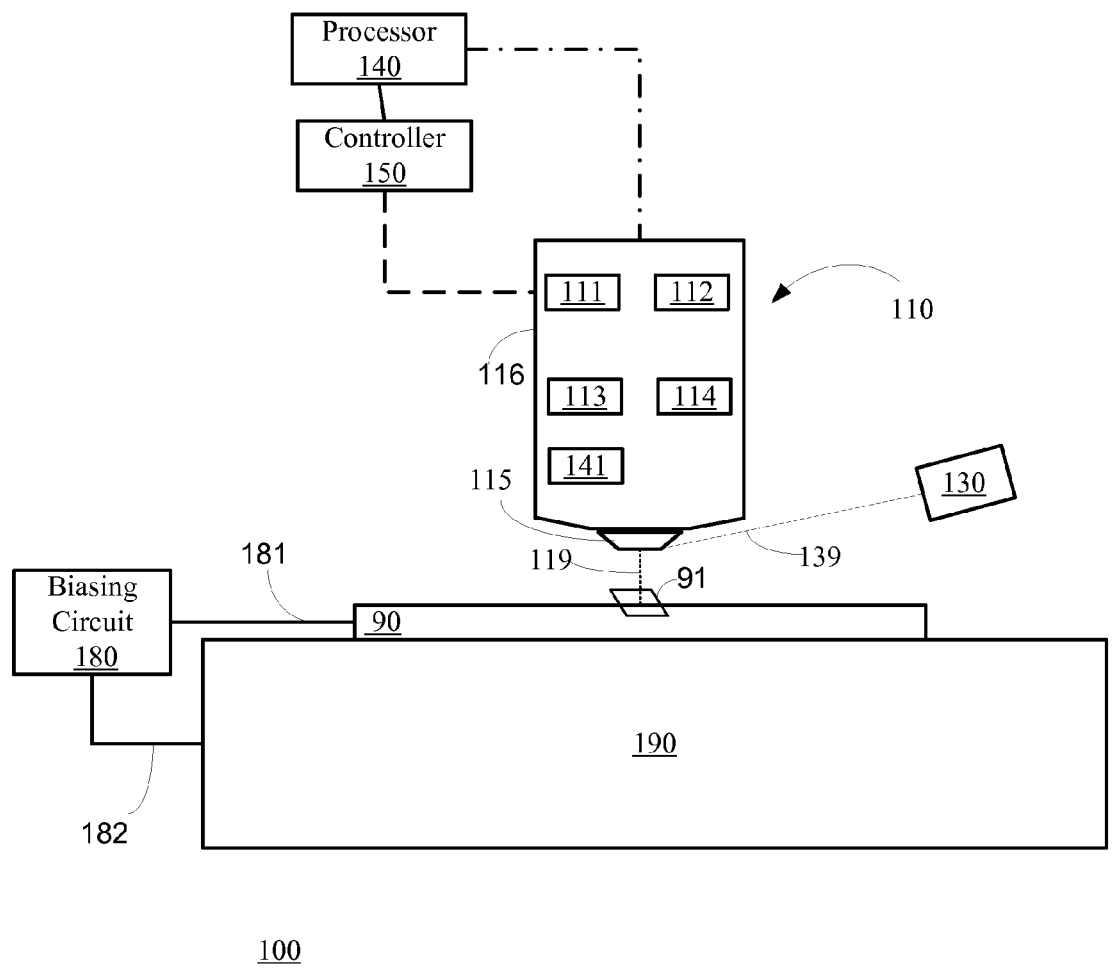
FIG. 1A illustrates a system and an object according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

The assignment of the same reference numbers to various components may indicate that these components are similar to each other.

The term "and/or" means additionally or alternatively. A and/or B includes only A, only B or A and B.

FIGS. 1A, 1B, 1C, 1D, 1E and 1F illustrate system 100 according to various embodiment of the invention.

FIGS. 1A, 1B, 1C, 1D, 1E, 1F, 2A, 2B, 2C, 2D, 2E, 2F and 2G illustrate an electron beam 119 and light beam 139. FIGS. 1C, 2C and 2D also illustrates light beam 139'.

According to an embodiment of the invention the electron beam 119 and the light beam 139 may impinge on object 90 at the same time.

Alternatively, the electron beam 119 and the light beam 139 may impinge on object 90 at different times.

According to an embodiment of the invention there may be a predefined timing difference between the illumination of the object 90 with the light beam 139 and the illumination of the object 90 with the electron beam 119.

According to an embodiment of the invention the electron beam 119 and the light beam 139' may impinge on object 90 at the same time.

Alternatively, the electron beam 119 and the light beam 139' may impinge on object 90 at different times.

According to an embodiment of the invention there may be a predefined timing difference between the illumination of the object 90 with the light beam 139' and the illumination of the object 90 with the electron beam 119.

According to an embodiment of the invention light beams 139 and 139' may impinge on object 90 at the same time.

Alternatively, light beams 139 and 139' may impinge on object 90 at different times.

Light beam 139 and electron beam 119 may illuminate different locations within the first area 91 or the same location within first area 91.

Referring to FIG. 1A—system 100 includes electron optics 110, light optics 130, mechanical stage 190, controller 150, processor 140 and biasing circuit 180.

Biasing circuit 180 may provide bias signals to object 90 (via conductor 181) and to mechanical stage 190 (via conductor 182). Object 90 and mechanical stage 190 may be biased to the same voltage or to different voltages.

Controller 150 is configured to control the electron optics 110 and the light optics 130.

Mechanical stage 190 is configured to support object 90 and move the object 90 in relation to the electron optics 110.

Electron optics 110 is configured to scan an first area 91 of object 90 with at least one electron beam (such as electron beam 119). It is noted that multiple areas of object 90 may be scanned.

The scanning of the first area 91 results in an emission of electrons (such as secondary electrons and/or backscattered electrons) that may be detected by one or more detectors such as detector 141.

The detector 141 may generate detection signals that may be processed by processor 140 to provide an image of first area 91. The electron optics 110 may include more than a single detector. The electron optics 110 may include one or more out-of-lens detector.

The scanning of first area 91 may charge the first area 91. The charging may distort the image of first area 91, future images of first area 91 and images or areas that are electrically coupled to first area 91.

The electron optics 110 may include multiple electrodes such as electrodes 11, 112, 113, 114 and 115. The electrodes may be used for electron beam shaping, electron beam deflection, electron beam focusing, and the like.

First electrode 115 may be the closet electrode to the object 90. Alternatively—first electrode 155 may not be the closest electrode to the object 90.

Light optics 130 is configured to illuminate at least one target of (a) the first electrode 115 and (b) the object 90 thereby causing an emission of electrons between the first electrode 115 and first area 91. The emission of the electrons depends upon the target that is illuminated and upon the relative potentials of the first electrode 115 and the object 90. Light optics 130 may include a laser, one or more filters, one or more lenses and the like.

When a target out of the first electrode 115 and object 90 is illuminated by the light optics 130, photo electrons are generated. Photo electrons will be emitted if the target is more negative than the other target.

Controller 150 is configured which target to illuminate. The determination of which target to illuminate may be responsive, for example, to the biasing signals provided to the area and to the first electrode.

In FIG. 1A the light optics 130 illuminates only the first electrode 115 (by light beam 139).

Figure 1B:
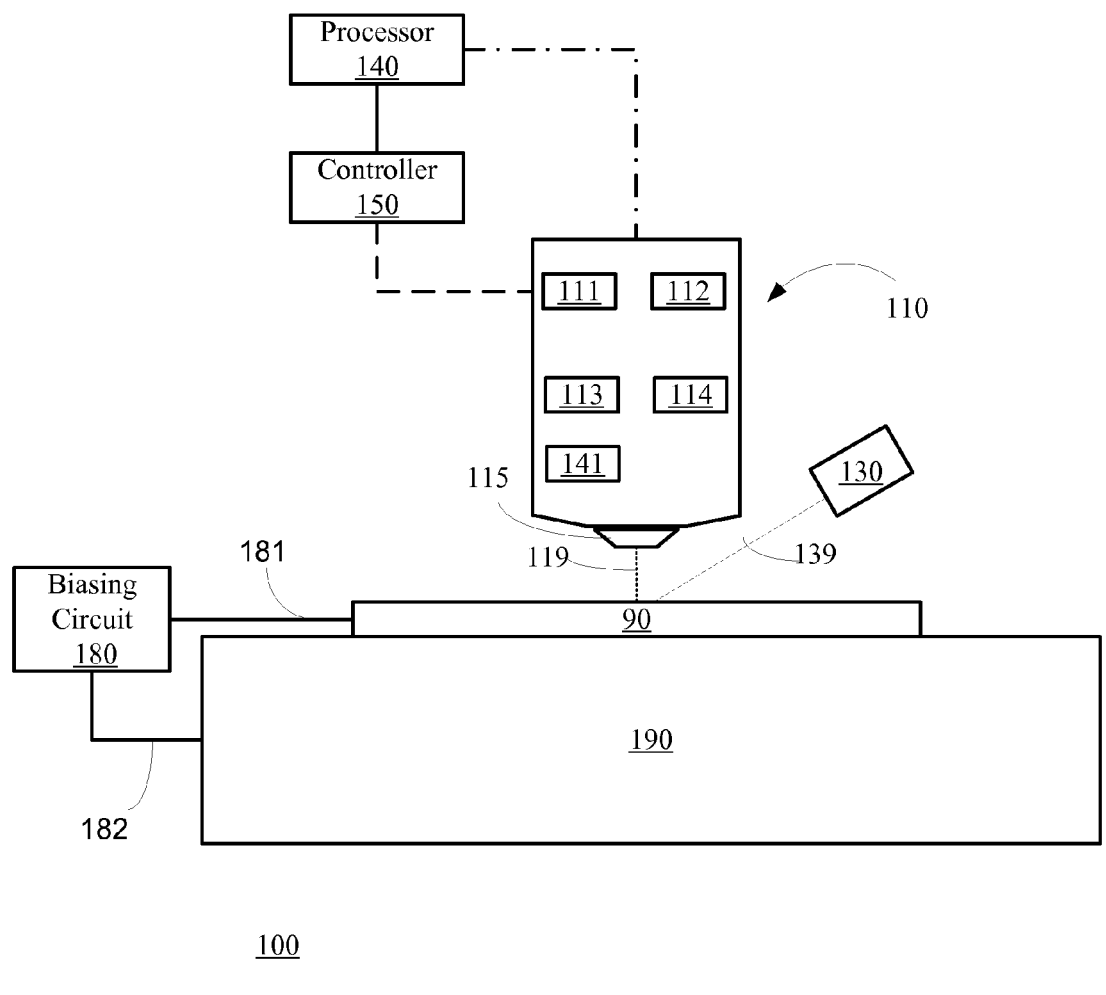
FIG. 1B illustrates a system and an object according to an embodiment of the invention.
Figure 1C:
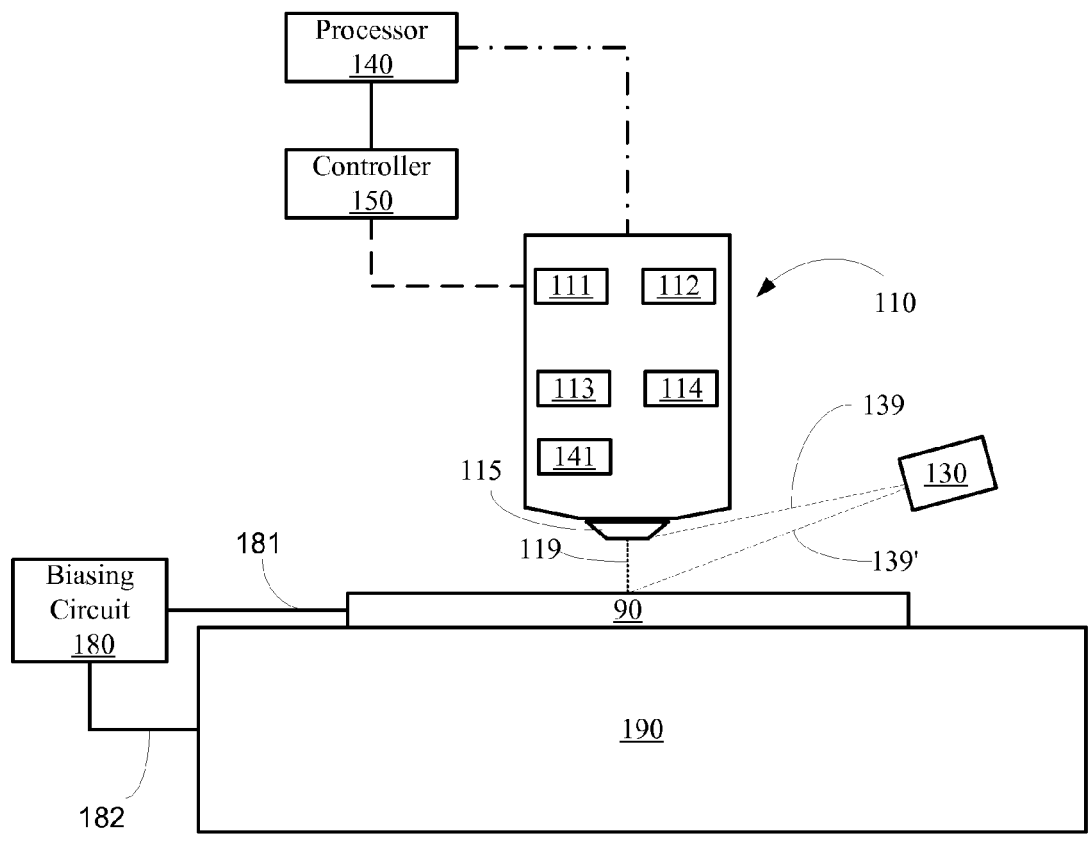
FIG. 1C illustrates a system and an object according to an embodiment of the invention.

In FIG. 1B the light optics 130 illuminates only the object (by light beam 139).

In FIG. 1C the light optics 130 illuminates the first electrode 115 and the object (by light beams 139 and 139).

The emission of the electrons partially or fully compensates for the charging of the first area 91 during the scanning.

Figure 1D:
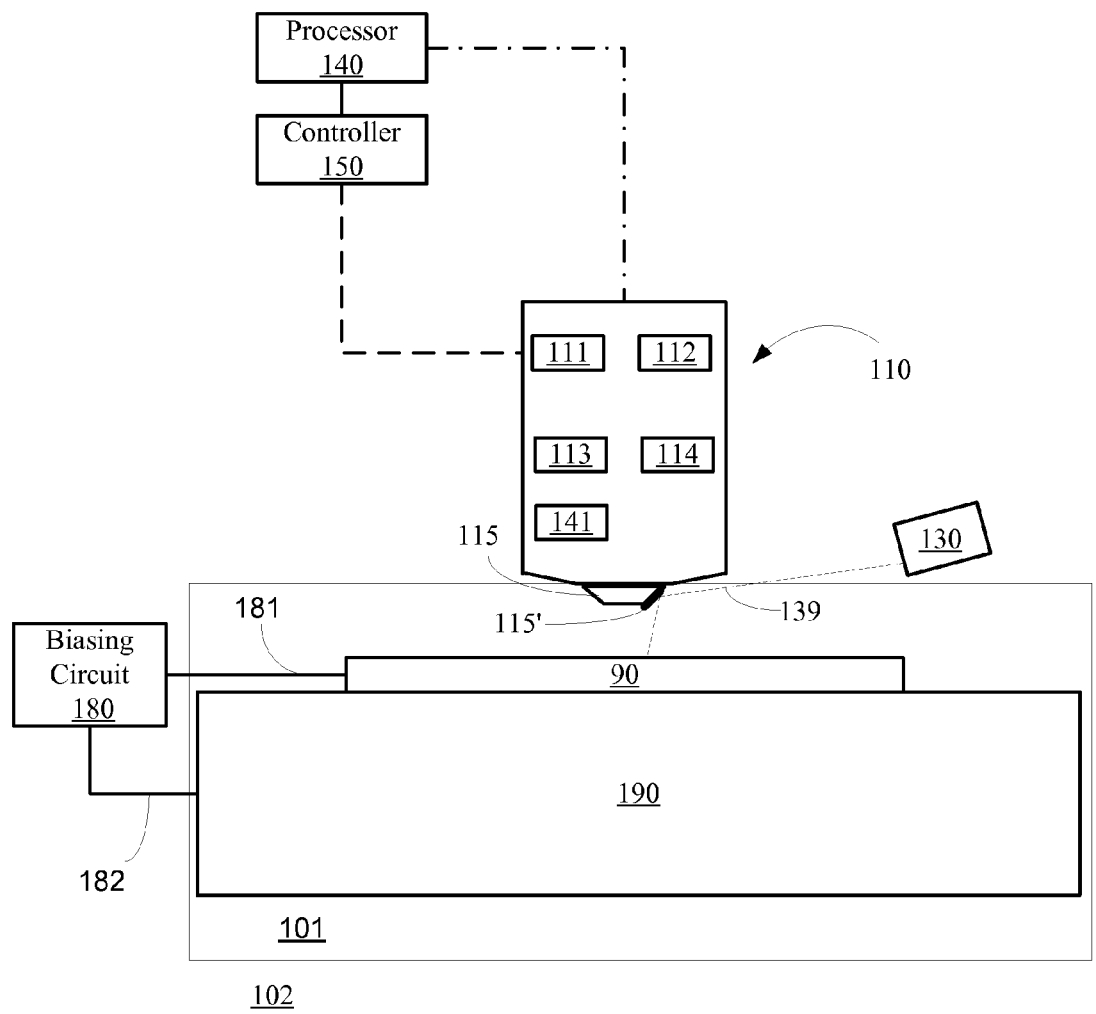
FIG. 1D illustrates a system and an object according to an embodiment of the invention.

FIG. 1D illustrates system 102 according to an embodiment of the invention. System 102 of FIG. 1D differs from system 100 of FIG. 1A by including a metal mirror 115' that is electrically coupled to the first electrode 115 and may be maintained at the same potential as the first electrode 115.

FIG. 1D also illustrates system 102 as including a vacuum chamber 101. The object 90, mechanical stage 190 and at least a portion of the electron optics 110 are positioned within the vacuum chamber 101. It should be noted that system 100 of FIGS. 1A, 1B and 1C and system 104 of FIG. 1E may also include a vacuum chamber.

Metal mirror 115' is configured to deflect a beam of light from light optics 130 towards the object 90 and thereby facilitates an illumination of both the first electrode 115 and the object 90 at the same time—using a single light beam from light optics 130.

The illumination of the metal mirror 115' may cause the metal mirror 115' to emit electrons towards the area 31—especially when area 31 is more positive than the metal mirror 115'.

Figure 1E:
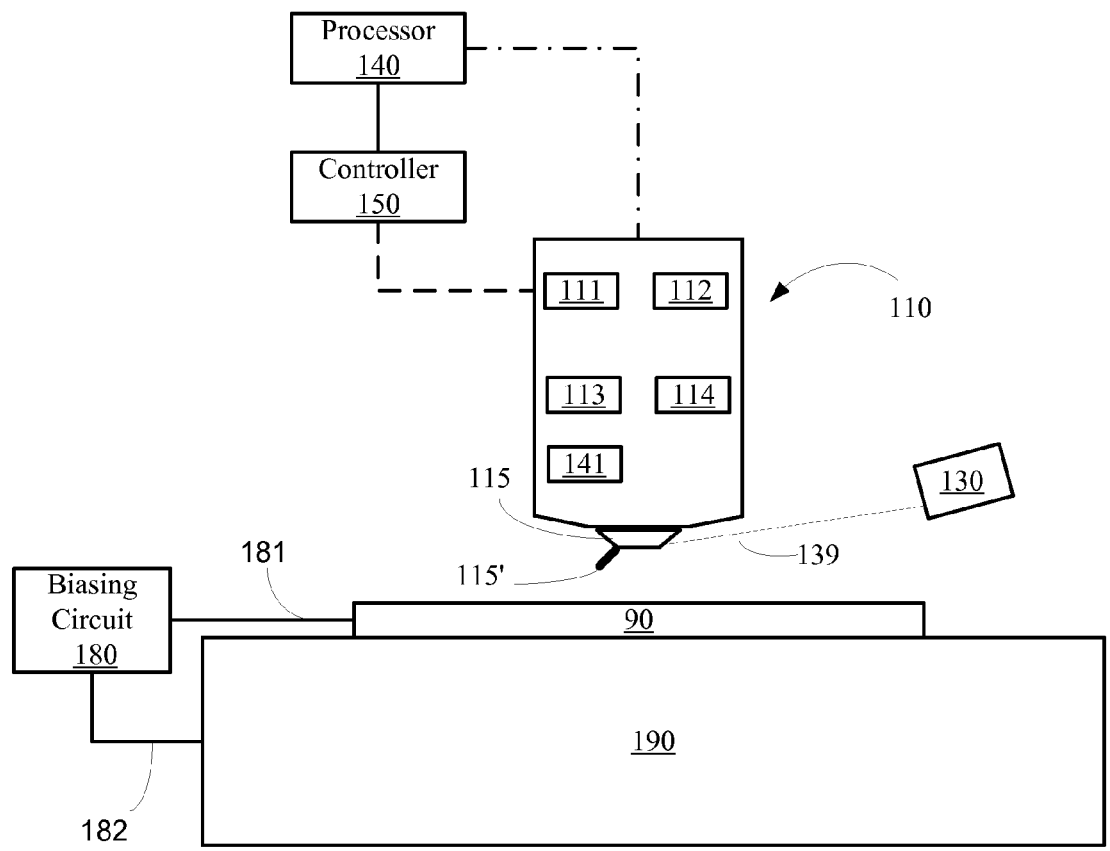
FIG. 1E illustrates a system and an object according to an embodiment of the invention.

FIG. 1E illustrates a system 104 according to an embodiment of the invention.

System 103 of FIG. 1E differs from system 102 of FIG. 1D by the location of the metal mirror 115'.

Figure 1F:
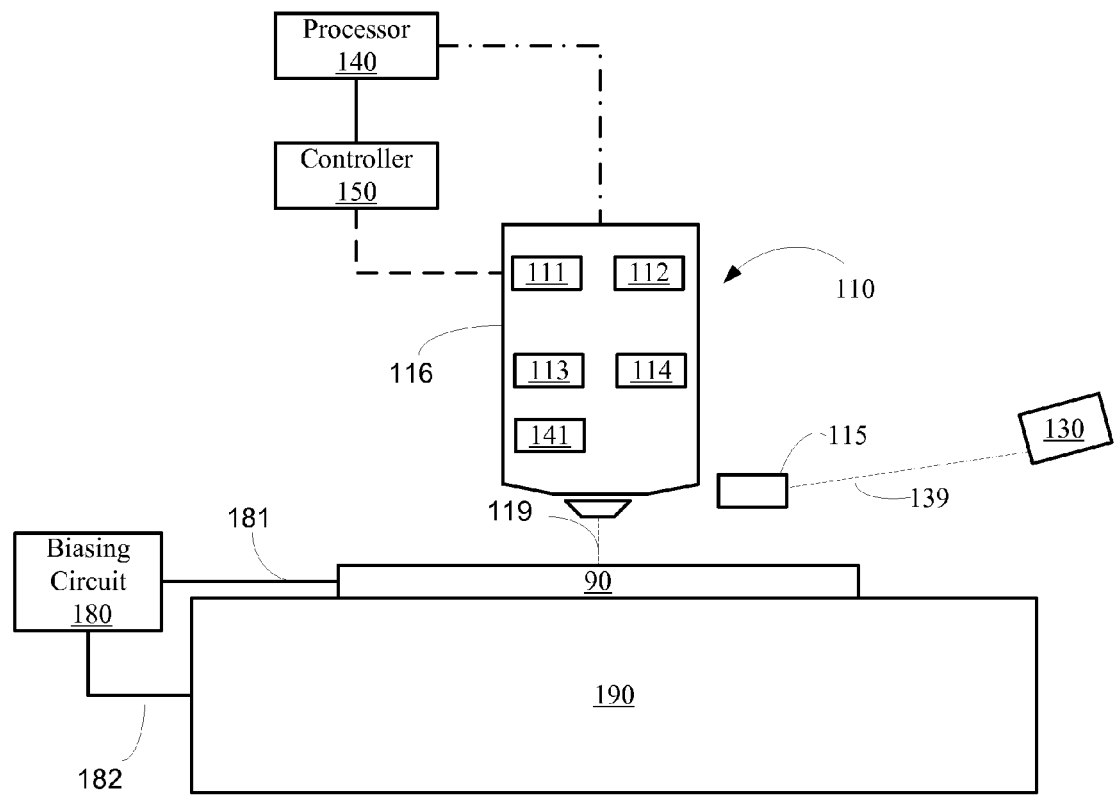
FIG. 1F illustrates a system and an object according to an embodiment of the invention.

FIG. 1F illustrates a system 104 according to an embodiment of the invention.

System 104 of FIG. 1F differs from system 100 of FIG. 1A by the location of the first electrode 115—in FIG. 1F the first electrode 115 is spaced apart from column 116 while in FIG. 1A the first electrode 115 is a part of column 116.

The object 90 of FIG. 1F may be a conductive mask and electrons emitted from the first electrode 115 can impinge on an area that may be spaced apart from the first area 91 that is scanned by electron beam 119.

FIG. 2A illustrates a portion of system 100 and emitted electrons 201 according to an embodiment of the invention.

In FIG. 2A only first electrode 115 is illuminated. It is assumed that the first area 91 is more positive (due to bias voltage and/or scan induced charging) than first electrode 115 so that electrons 201 are emitted from the first electrode 115 towards the first area 91. The emission of electrons may stop when first area 91 and first electrode 115 reach the same potential.

Figure 2B:
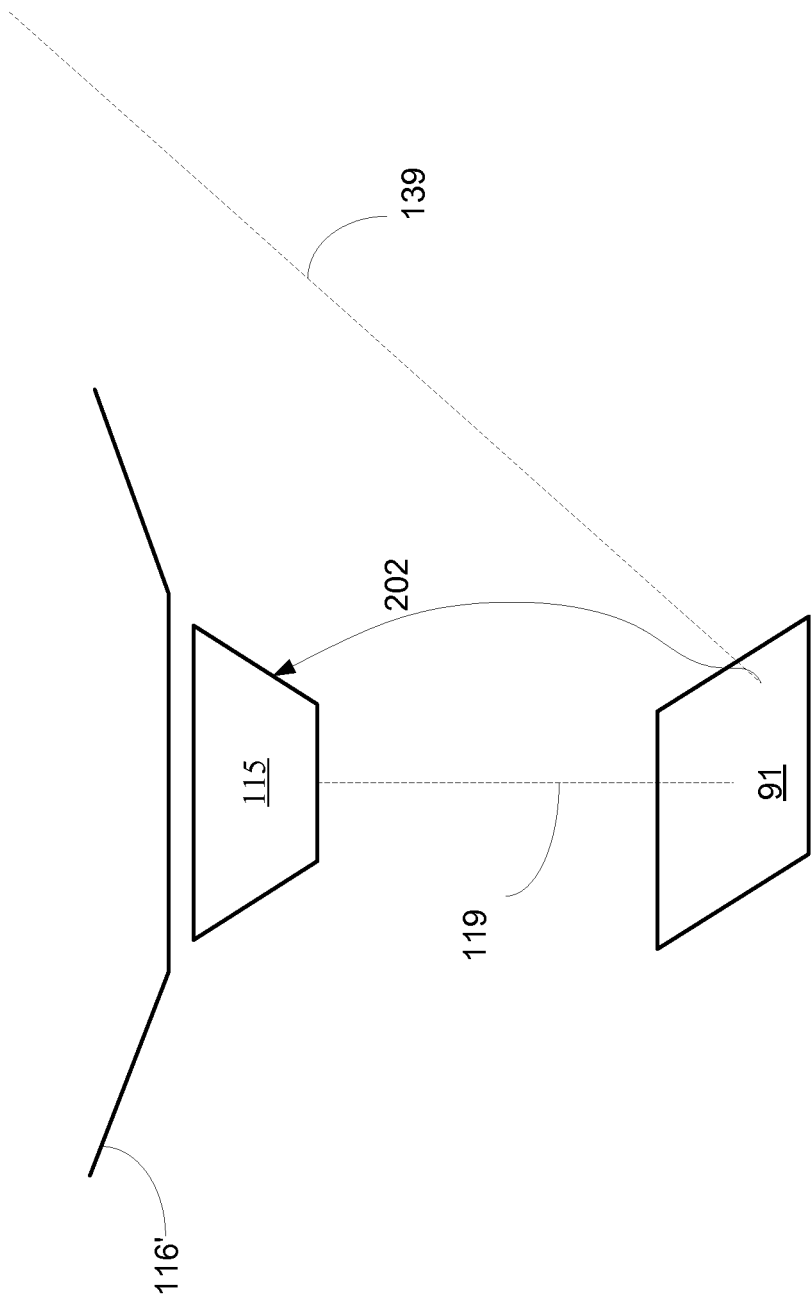
FIG. 2B illustrates a portion of a system and emitted electrons according to an embodiment of the invention.
Figure 2C:
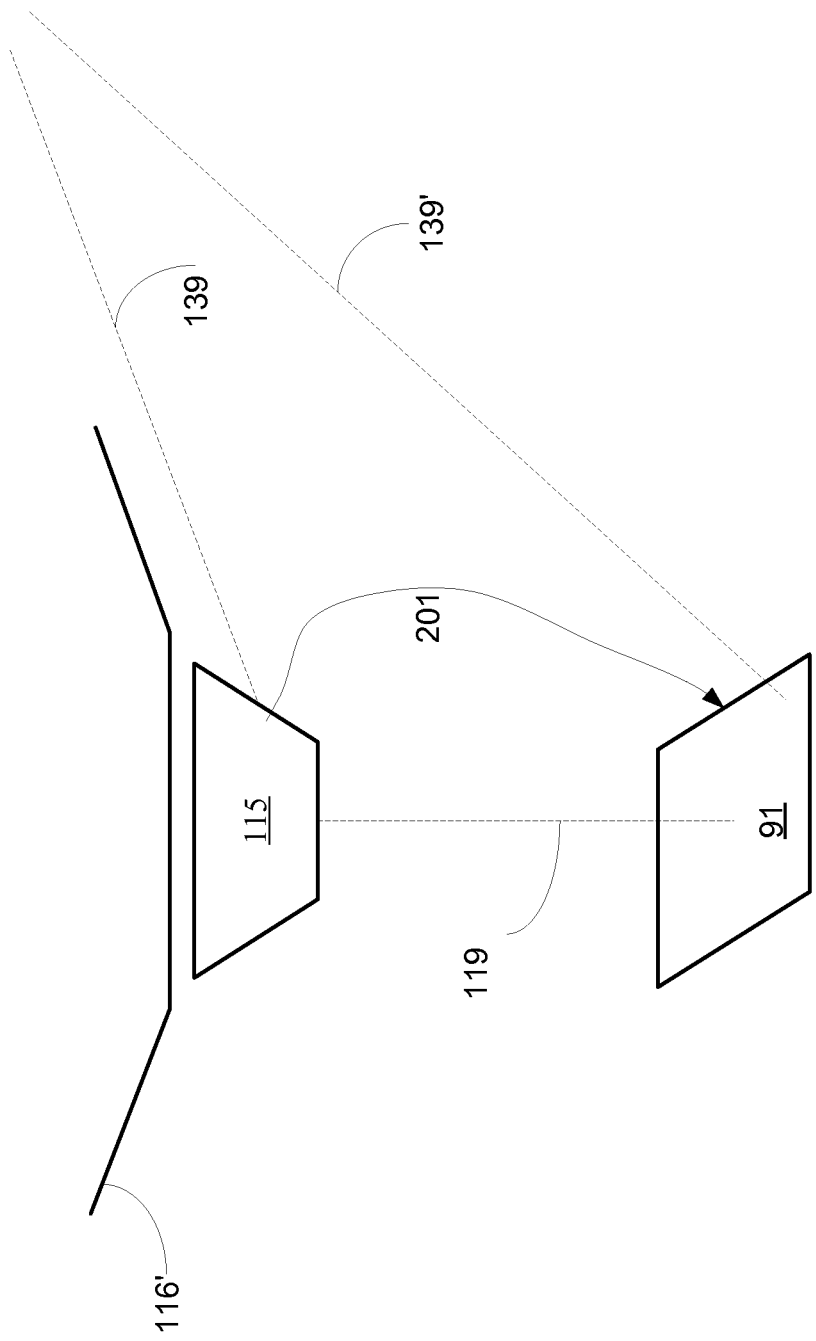
FIG. 2C illustrates a portion of a system and emitted electrons according to an embodiment of the invention.
Figure 2D:
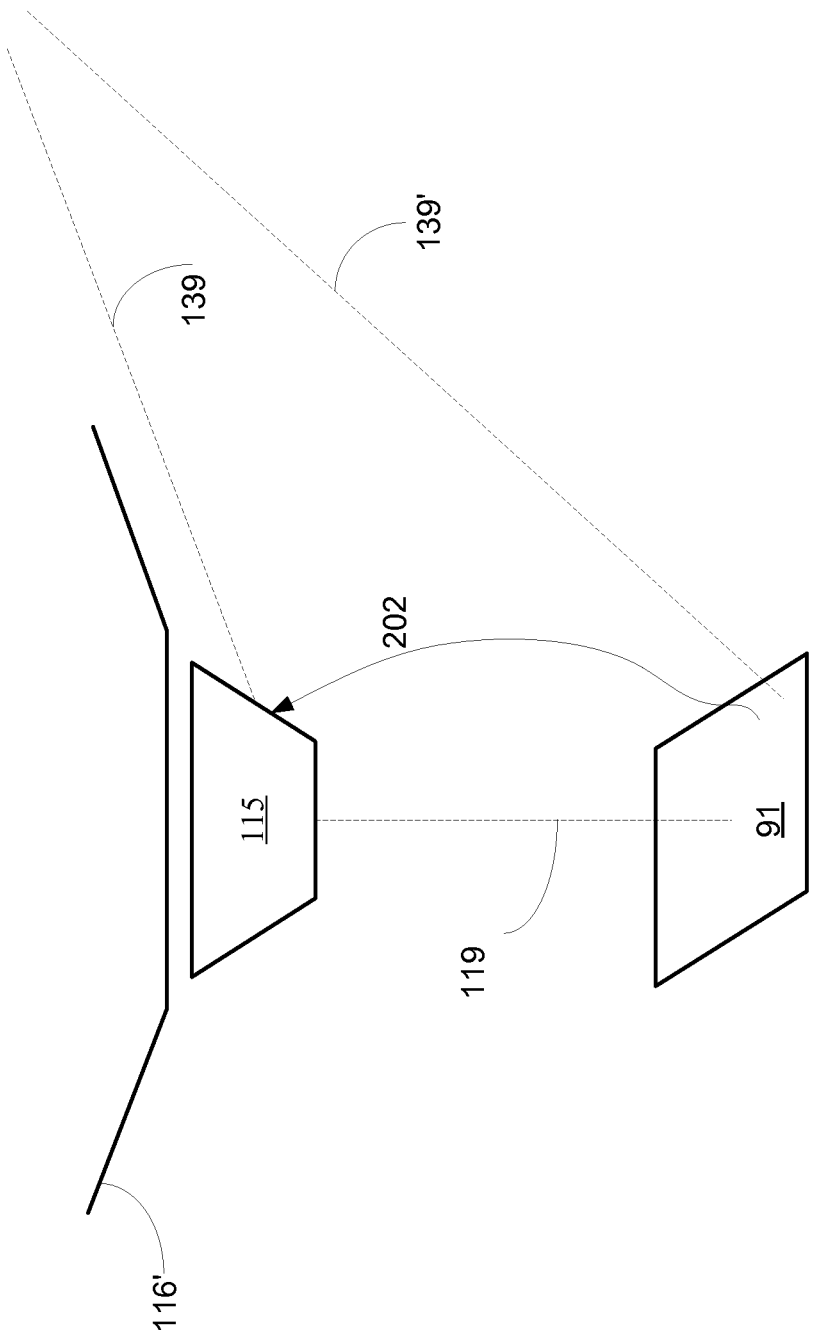
FIG. 2D illustrates a portion of a system and emitted electrons according to an embodiment of the invention.

FIG. 2B illustrates a portion of system 100 and emitted electrons 202 according to an embodiment of the invention.

In FIG. 2B only first area 91 is illuminated. It is assumed that the first area 91 is more negative (due to bias voltage and/or scan induced charging) than first electrode 115 so that electrons 202 are emitted from first area 91 to the first electrode 115. The emission of electrons may stop when first area 91 and first electrode 115 reach the same potential.

FIG. 2C illustrates a portion of system 100 and emitted electrons 201 according to an embodiment of the invention.

In FIG. 2C first electrode 115 is illuminated by light beam 139 and first area 91 is illuminated by another light beam 139.

It is assumed that the first area 91 is more positive (due to bias voltage and/or scan induced charging) than first electrode 115 so that electrons 201 are emitted from the first electrode 115 to first area 91. The emission of electrons may stop when first area 91 and first electrode 115 reach the same potential.

FIG. 2D illustrates a portion of system 100 and emitted electrons 202 according to an embodiment of the invention.

In FIG. 2D first electrode 115 is illuminated by light beam 139 and first area 91 is illuminated by another light beam 139.

It is assumed that the first area 91 is more negative (due to bias voltage and/or scan induced charging) than first electrode 115 so that electrons 202 are emitted from first area 91 to the first electrode 115. The emission of electrons may stop when first area 91 and first electrode 115 reach the same potential.

Figure 2E:
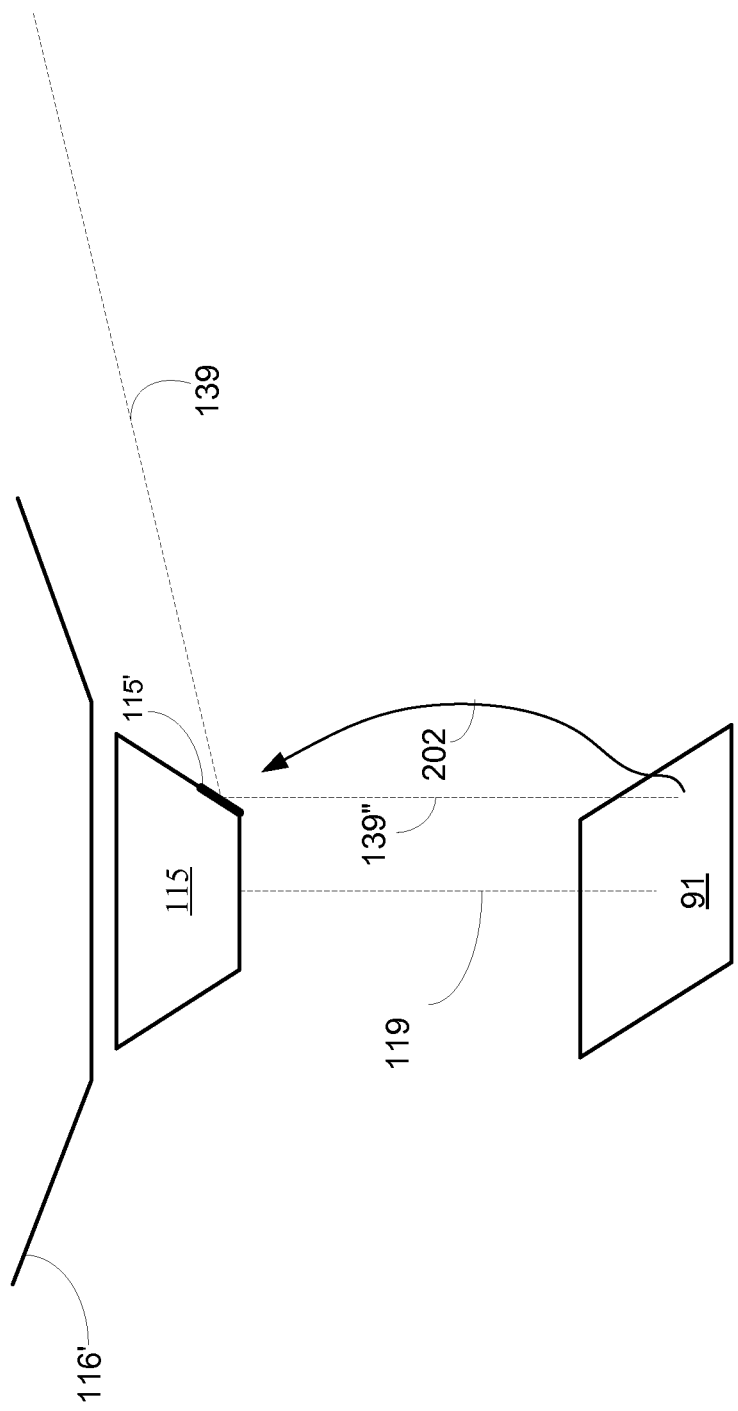
FIG. 2E illustrates a portion of a system and emitted electrons according to an embodiment of the invention.

FIG. 2E illustrates a portion of system 100 and emitted electrons 202 according to an embodiment of the invention.

In FIG. 2E metal mirror 115' is illuminated by light beam 139. Metal mirror 115' deflects the light beam to provide a deflected light beam 139" that impinges on first area 91.

It is assumed that the first area 91 is more negative (due to bias voltage and/or scan induced charging) than first electrode 115 so that electrons 202 are emitted from first area 91 to the first electrode 115. The emission of electrons may stop when first area 91 and first electrode 115 reach the same potential.

Figure 2F:
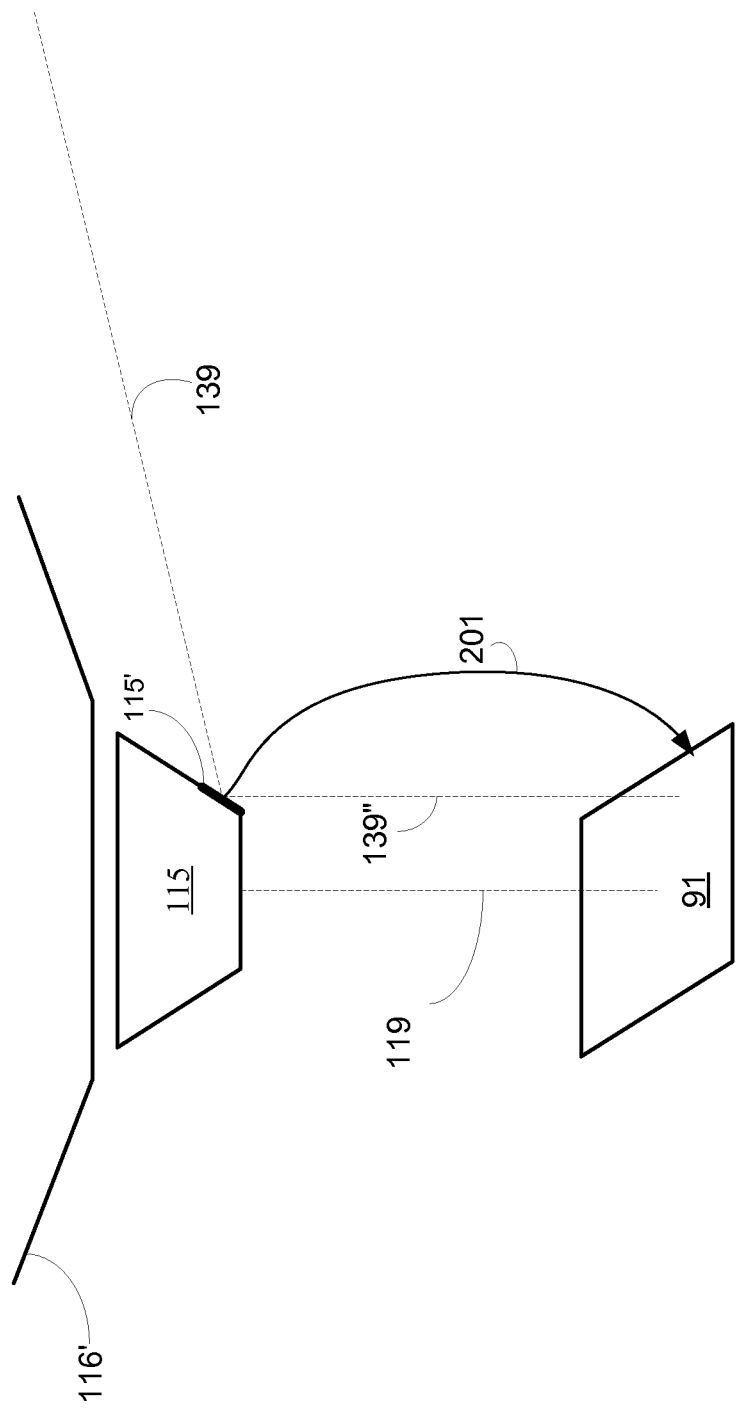
FIG. 2F illustrates a portion of a system and emitted electrons according to an embodiment of the invention.

FIG. 2F illustrates a portion of system 100 and emitted electrons 201 according to an embodiment of the invention.

In FIG. 2F metal mirror 115' is illuminated by light beam 139. Metal mirror 115' deflects the light beam to provide a deflected light beam 139" that impinges on first area 91.

It is assumed that the first area 91 is more positive (due to bias voltage and/or scan induced charging) than first electrode 115 so that electrons 201 are emitted from first electrode 115 to first area 91. The emission of electrons may stop when first area 91 and first electrode 115 reach the same potential.

Figure 2G:
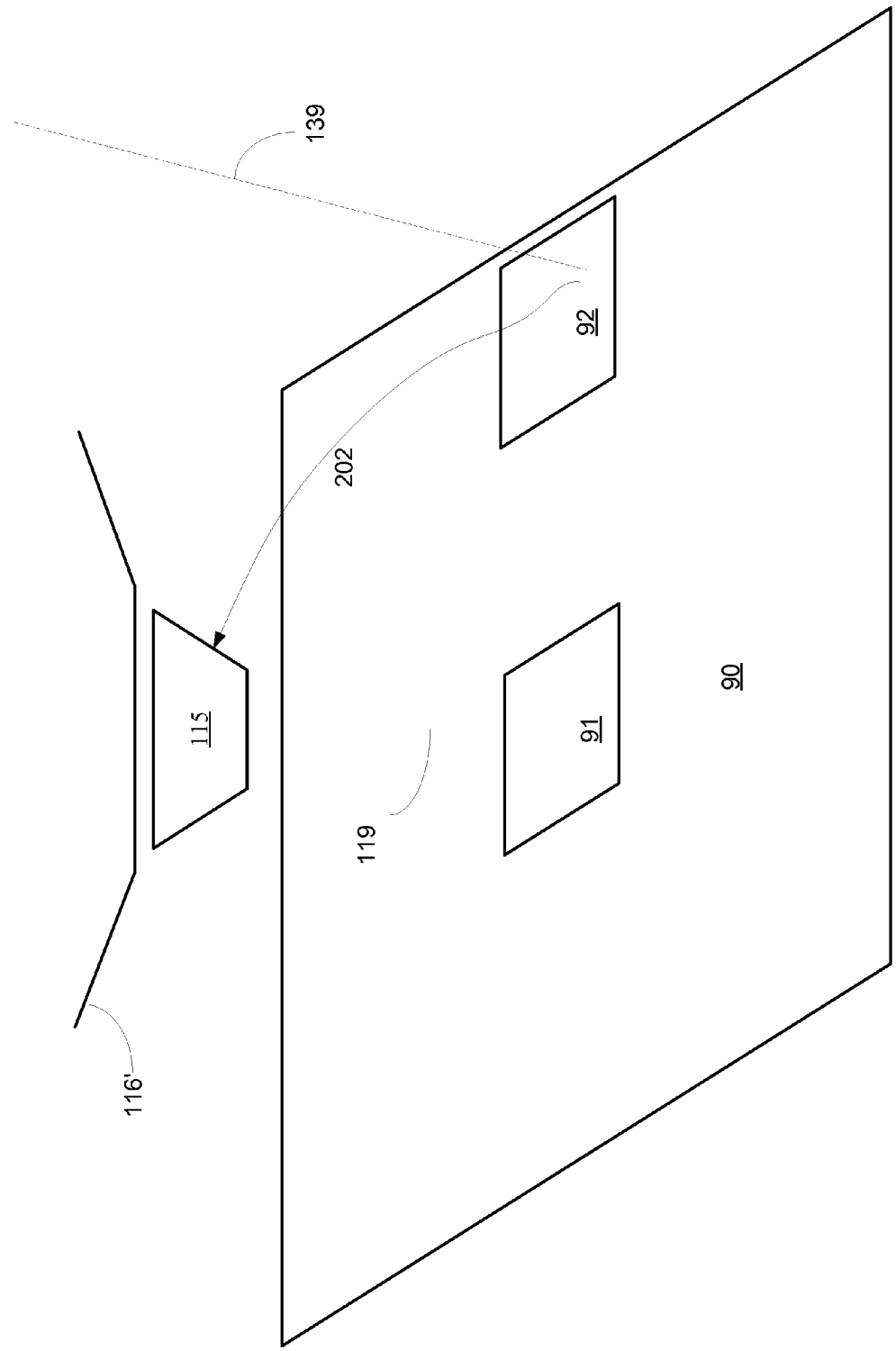
FIG. 2G illustrates a portion of a system and emitted electrons according to an embodiment of the invention.

FIG. 2G illustrates a portion of system 100 and emitted electrons 202 according to an embodiment of the invention.

It is assumed that the object 90 is conductive or at least includes one or more areas that differ from first area 91 but are electrically coupled to first area 91. For example—object 90 may be a photolithographic mask (mask).

In FIG. 2B area 92 of object 90 (and not first area 91) is illuminated. Area 92 is not currently imaged but it is electrically coupled to first area 91 (that is being imaged).

It is assumed that the area 92 is more negative (due to bias voltage and/or scan induced charging) than first electrode 115 so that electrons 202 are emitted from area 92 to the first electrode 115. The emission of electrons may stop when area 92 and first electrode 115 reach the same potential.

FIG. 3 is a cross sectional view of a portion of a system according to an embodiment of the invention.

The portion may include a cover 171 of a vacuum chamber. Light optics 130 is positioned above the vacuum chamber and is configured to output a beam of light via a hole 172 formed in the cover 171. The beam of light impinges on an intermediate mirror 115" positioned within the vacuum chamber and is deflected towards metal mirror 115' that is coupled to first electrode 115. Deflected light beam 139" from metal mirror 115' is directed towards first area 91.

Figure 4:
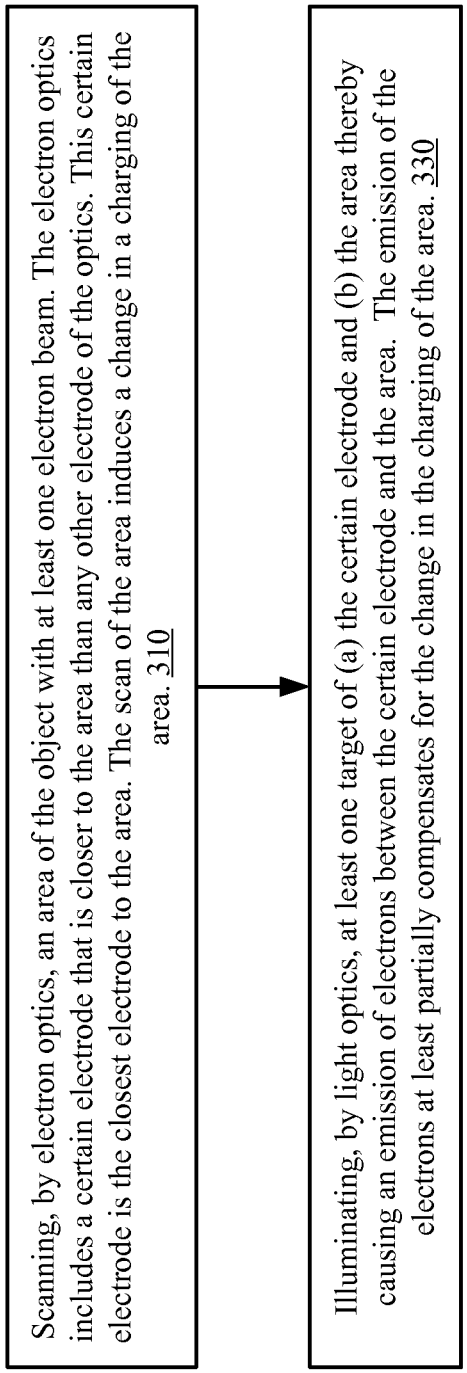
FIG. 4 illustrates a method according to an embodiment of the invention.

FIG. 4 illustrates method 300 according to an embodiment of the invention.

Method 300 may start by step 310 of scanning, by electron optics, an area of the object with at least one electron beam. The electron optics includes a first electrode that is closer to the area than any other electrode of the optics. This first electrode is the closest electrode to the area. The scan of the area induces a change in a charging of the area.

Step 310 may be followed by step 330 of illuminating, by light optics, at least one target of (a) the first electrode and (b) the area thereby causing an emission of electrons between the first electrode and the area. The emission of the electrons at least partially compensates for the change in the charging of the area. For example—the emitted electrons may discharge the area.

Figure 5:
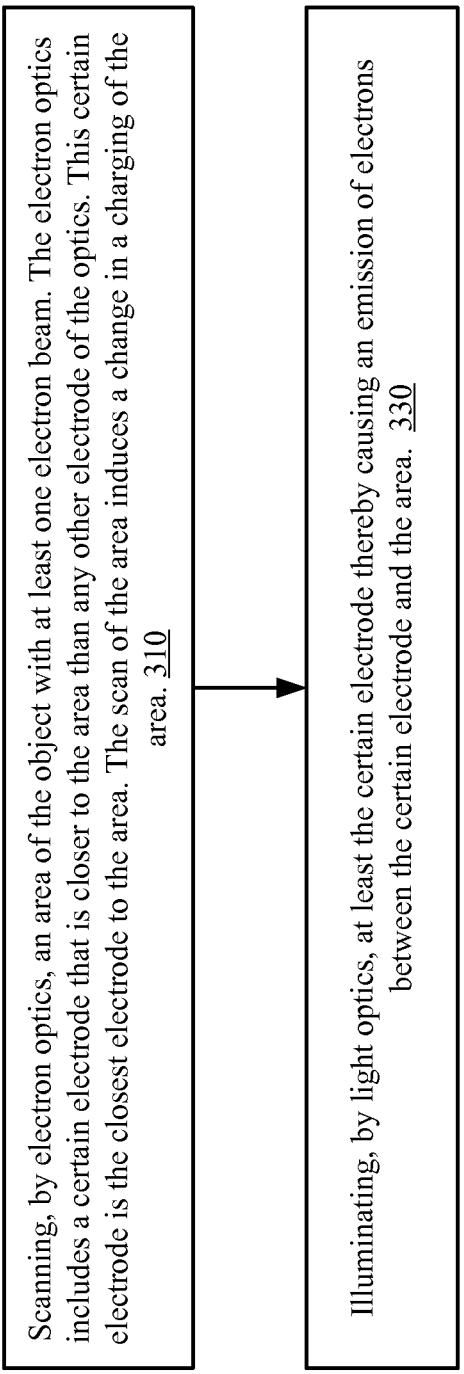
FIG. 5 illustrates a method according to an embodiment of the invention.

FIG. 5 illustrates method 301 according to an embodiment of the invention.

Method 301 may start by step 310 of scanning, by electron optics, an area of the object with at least one electron beam. The electron optics includes a first electrode that is closer to the area than any other electrode of the optics. This first electrode is the closest electrode to the area. The scan of the area induces a change in a charging of the area.

Step 310 may be followed by step 330 of illuminating, by light optics, at least the first electrode thereby causing an emission of electrons between the first electrode and the area. The emission of the electrons may at least partially compensate for the change in the charging of the area. For example—the emitted electrons may discharge the area.

In the foregoing specification, the invention has been described with reference to specific examples of embodiments of the invention. It will, however, be evident that various modifications and changes may be made therein without departing from the broader spirit and scope of the invention as set forth in the appended claims.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or module elements or impose an alternate decomposition of functionality upon various logic blocks or module elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A system for imaging an object, the system comprising:
electron optics configured to scan a first area of the object with at least one electron beam; wherein the electron optics comprise a first electrode;
a metal mirror coupled to the first electrode; and
light optics configured to illuminate at least the metal mirror with a beam of light, the metal mirror arranged to direct the beam of light towards the object, thereby causing an emission of electrons between the first electrode and the object.

2. The system according to claim 1, wherein the metal mirror is arranged to direct the beam of light towards the first area, thereby causing an emission of electrons between the first electrode and the first area.

3. The system according to claim 1, wherein the light optics are configured to illuminate both the metal mirror and the object.

4. The system according to claim 1, wherein the electrode comprises a first target and the object comprises a second target, the system further comprising a controller configured to determine which target of the first target and the second target to illuminate by the light optics.

5. The system according to claim 1, wherein the metal mirror is configured to direct the beam of light towards the first area.

6. The system according to claim 1, wherein the light optics are configured to illuminate the first area and the metal mirror simultaneously.

7. The system according to claim 1, wherein the light optics are configured to illuminate the first area and the metal mirror at different points in time during a scan period during which the first area is scanned.

8. The system according to claim 1, further comprising biasing circuits for providing a same biasing voltage to the first electrode and to the object.

9. The system according to claim 1, wherein the metal mirror is electrically coupled to the first electrode.

10. The system according to claim 1, wherein the first electrode is closer to the object than any other electrode of the electron optics.

11. The system according to claim 1, wherein the electron optics comprise a column and wherein the first electrode is spaced apart from the column.

12. A system for imaging an object, the system comprising:
electron optics configured to scan a first area of the object with at least one electron beam; wherein the electron optics comprise a first electrode;
a metal mirror electrically coupled to the first electrode; and
light optics configured to illuminate the metal mirror with a beam of light, the metal mirror arranged to direct the beam of light towards the object, thereby causing the metal mirror to emit electrons towards the object when the object is more positive than the first electrode.

13. The system according to claim 12, wherein the light optics are further configured to illuminate the first area thereby causing the first area to emit electrons towards the first electrode when the first area is more negative than the first electrode.

14. The system according to claim 12, wherein the metal mirror is configured to direct the beam of light towards the first area.

15. The system according to claim 12, further comprising biasing circuits for providing different biasing voltages to the first electrode and to the object.

16. The system according to claim 12, wherein the first electrode is closer to the object than any other electrode of the electron optics.

17. The system according to claim 12, wherein the electron optics comprise a column and wherein the first electrode is spaced apart from the column.

18. A system for imaging an object, the system comprising:
electron optics configured to scan a first area of the object with at least one electron beam; wherein the electron optics comprise a first electrode;
a metal mirror coupled to the first electrode; and
light optics configured to illuminate the first electrode and the object at the same time using the metal mirror, thereby causing (i) an emission of electrons from the first electrode towards the object when the object is more positive than the first electrode; and (ii) an emission of electrons from the object towards the first electrode when the object is more negative than the first electrode.

19. The system according to claim 18 wherein the first electrode is closer to the object than any other electrode of the electron optics.

20. The system according to claim 18 wherein the electron optics comprise a column and wherein the first electrode is spaced apart from the column.

* * * * *